United States Patent [19]

Kawai

[11] 4,259,741
[45] Mar. 31, 1981

[54] SATELLITE RELAY SYSTEM

[75] Inventor: Makoto Kawai, Yokohama, Japan

[73] Assignee: Nippon Telegraph and Telephone Public Corp., Tokyo, Japan

[21] Appl. No.: 17,254

[22] Filed: Mar. 5, 1979

[30] Foreign Application Priority Data

Mar. 3, 1978 [JP] Japan .................................. 53/23586

[51] Int. Cl.³ ............................................ H04B 7/185
[52] U.S. Cl. ........................................ 455/12; 370/75
[58] Field of Search .................. 343/100 ST, 100 SA, 343/854; 325/4, 14; 179/15 A, 15 AD, 15 AL, 15 BS; 178/69.1; 455/12, 13; 370/75

[56] References Cited
U.S. PATENT DOCUMENTS

| | | | |
|---|---|---|---|
| 3,864,679 | 2/1975 | Hannan et al. | 343/100 SA |
| 3,922,680 | 11/1975 | Alsberg et al. | 343/100 SA |
| 3,928,804 | 12/1975 | Schmidt et al. | 343/100 ST |
| 4,090,199 | 5/1978 | Archer | 343/100 SA |
| 4,105,973 | 8/1978 | Arnold et al. | 179/15 BS |
| 4,122,453 | 10/1978 | Profera | 343/100 SA |

*Primary Examiner*—Benedict V. Safourek

*Attorney, Agent, or Firm*—Armstrong, Nikaido, Marmelstein & Kubovcik

[57] ABSTRACT

A satellite relay system for Time Division Multiple Access (TDMA) utilizing a beam scanning technique has been found. According to the present invention a plurality of antennas each relating to the corresponding earth station have a narrow spot beam with sharp directivity. Each of the up-link bursts (a signal from an earth station to a satellite) is simply combined, and a single-channel TDMA signal is obtained. Said TDMA signal is then divided into a plurality of signals by a power divider after frequency conversion. Each of said signals is processed by a variable phase shifter, the output of which is applied to a power amplifier. A 2n-port directional coupler having n number of input terminals and n number of output terminals is provided and each of said input terminals is connected to the output of the corresponding power amplifier. Each of the output signals of the 2n-port directional coupler provides a down-link burst and is connected to the corresponding transmission antenna which has a sharp directivity covering only a single specific earth station. The 2n-port directional coupler is composed of a plurality of couplers or hybrid circuits.

7 Claims, 17 Drawing Figures

OUTPUT BEAM

| | #1 | #2 | #3 | #4 | #5 | #6 | #7 | #8 |
|---|---|---|---|---|---|---|---|---|
| $D_1$ | 0 | 1 | 1 | 1 | 1 | 1 | 1 | 0 |
| $D_2$ | 1 | 1 | 0 | 1 | 0 | 1 | 0 | 0 |
| $D_3$ | 1 | 0 | 1 | 1 | 0 | 0 | 1 | 0 |
| $D_4$ | 0 | 0 | 0 | 1 | 1 | 0 | 0 | 0 |
| $D_5$ | 1 | 0 | 0 | 0 | 1 | 1 | 1 | 0 |
| $D_6$ | 0 | 0 | 1 | 0 | 0 | 1 | 0 | 0 |
| $D_7$ | 0 | 1 | 0 | 0 | 0 | 0 | 1 | 0 |
| $D_8$ | 1 | 1 | 1 | 0 | 1 | 0 | 0 | 0 |

PHASE SHIFTER

SATELLITE RELAY SYSTEM

BACKGROUND OF THE INVENTION

The present invention relates to a satellite relay system, in particular, relates to such a system utilizing a time division multiple access (TDMA) system.

In the TDMA system, a plurality of earth stations can access a single satellite system on a time divisional basis by designating a particular time slot to each earth station. And by re-arranging the signals of each time slot in a satellite station, the satellite transmits the re-arranged signals to each earth station, and each earth station can be connected to any other earth station through satellite system.

As the size of antennas for communication satellite systems is enlarging, it becomes advantageous to use a spot beam antenna for directivity and efficient utilization of available frequency bands. The utilization of a spot beam antenna requires interconnection of each beam in a satellite system, and a scanning spot-beam system is one system which provides such interconnection.

A prior scanning spot-beam system has utilized a phased-array antenna. One of the prior satellite relay system utilizing a phased array antenna has been disclosed in "A Scanning Spot-beam Satellite System" in the Bell System Technical Journal, vol 56, No. 8, Oct. 1977, pp 1549-1560.

Figure 1:
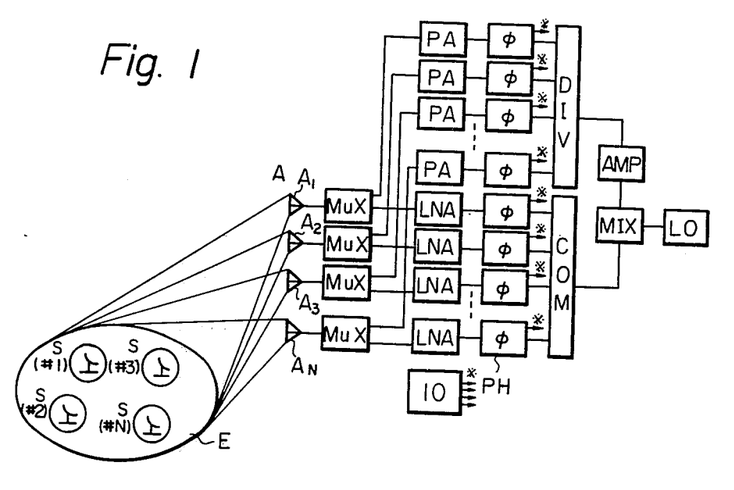
FIG. 1 is the block-diagram of a prior satellite relay system.

FIG. 1 shows a block-diagram of a prior phased-array type satellite relay system, and in the figure, E is the earth, S(#1) through S(#n) are earth stations and the circle surrounding each earth station shows the service area of each spot beam. The symbol A is an antenna mounted in a satellite station, and it should be appreciated that the spot beam of each antenna in a prior phased-array type satellite relay system is rather wide, and in order to obtain a narrow spot beam, that is to say, high antenna gain, a plurality of antennas, each of which is supplied a phase control signal, are utilized, then, by combining the wide spot beams of all the antennas a narrow spot beam is obtained.

In FIG. 1, the up-link signal, that is the signal from an earth station to the satellite station, is applied to the phase shifter(PH) through the antenna multiplexer(MUX) and the low noise amplifier(LNA). The antenna multiplexer (MUX) is provided for multiplexing receiving and transmitting operations in a single antenna, and the phase shifter (PH) operates to provide a narrow spot beam by shifting the phase of the signal of each antenna. The outputs of each phase shifter are combined in a single channel by the combiner(COM), the output of which is applied to the frequency mixer(MIX). The mixer(MIX) converts the frequency of the up-link signal to the down-link frequency according to the frequency of the local oscillator(LO), and the output of the mixer(MIX) is applied to the divider(DIV) through the amplifier(AMP). The divider(DIV) provides a plurality of channel signals by dividing the output power of the amplifier(AMP). Each of the outputs of the divider(DIV) is applied to said antenna multiplexer(MUX) through a phase shifter(PH) and a power amplifier(PA). The phase shifter(PH) operates to switch each down-link signal to a desired time slot and to provide a narrow spot beam for the transmission antenna. The output of the multiplexer is applied to the antenna, which covers the corresponding area on the earth. It should be appreciated that in the TDMA system, during the up-link the spot beam covers a single particular earth station, the down-link spot beam illuminates all the earth stations (#1 through #n), thus, communication between said particular station and each of the other earth stations is possible. That is to say, each earth station accesses the satellite station on a time divisional basis, and the switching between each earth station is performed in the satellite station itself.

However, a prior satellite relay system utilizing beam scanning by a phased-array antenna has the following disadvantages.

(a) Since the gain of the antenna system is proportional to the number of antenna elements, many antenna elements are required in order to obtain a narrow spot beam with sharp directivity.

(b) Since the directivity of each antenna element is not sharp but is broad, the combined directivity of all the elements has a periodic grating lobe at the outside of a service area.

(c) A digital phase shifter is generally utilized for controlling the exciting signal to each antenna element. However said digital phase shifter must have too many bits for realizing a sharp spot beam to an earth station, thus the structure of the control system must be complicated.

Further, it should be appreciated that a narrow spot beam antenna has not been utilized in a beam scanning satellite relay system since the high speed switching of high level signals is almost impossible, and said switching does not load the power amplifier.

SUMMARY OF THE INVENTION

It is an object, therefore, of the present invention to overcome the disadvantages and limitations of a prior satellite relay system by providing a new and improved satellite relay system.

It is also an object of the present invention to provide a satellite relay system which utilizes a plurality of narrow spot beam antennas with sharp directivity for the TDMA communication system, and performs the switching between each earth station by a beam scanning system.

The above and other objects are attained by a satellite relay system comprising a power divider which is supplied a TDMA signal and distributes it to a plurality of output terminals, a plurality of variable phase shifters each connected to the output of said power divider, a plurality of power amplifiers each connected to the output of said phase shifters, a 2n-port directional coupler having n number of input terminals and n number of output terminals, and each input terminal being connected to the output of said power amplifiers, and each output of said 2n-port directional coupler is connected to a specific transmission antenna having sharp directivity and covering only a single specific earth station. Said 2n-port directional coupler provides an output signal to each output terminal according to the amplitude and phase of the input signals on each input terminal. The presence of the 2n-port directional coupler and the sharp directivity of antenna are important features of the present invention. It should be appreciated that the switching or the beam scanning of a TDMA signal is substantially controlled by said phase shifters, which operate at a low signal level.

BRIEF DESCRIPTION OF THE DRAWINGS

The foregoing and other objects, features, and attendant advantages of the present invention will be appreciated as the same become better understood by means of the following discription and accompanying drawings wherein.

DESCRIPTION OF THE PREFERRED EMBODIMENTS

Figure 2:
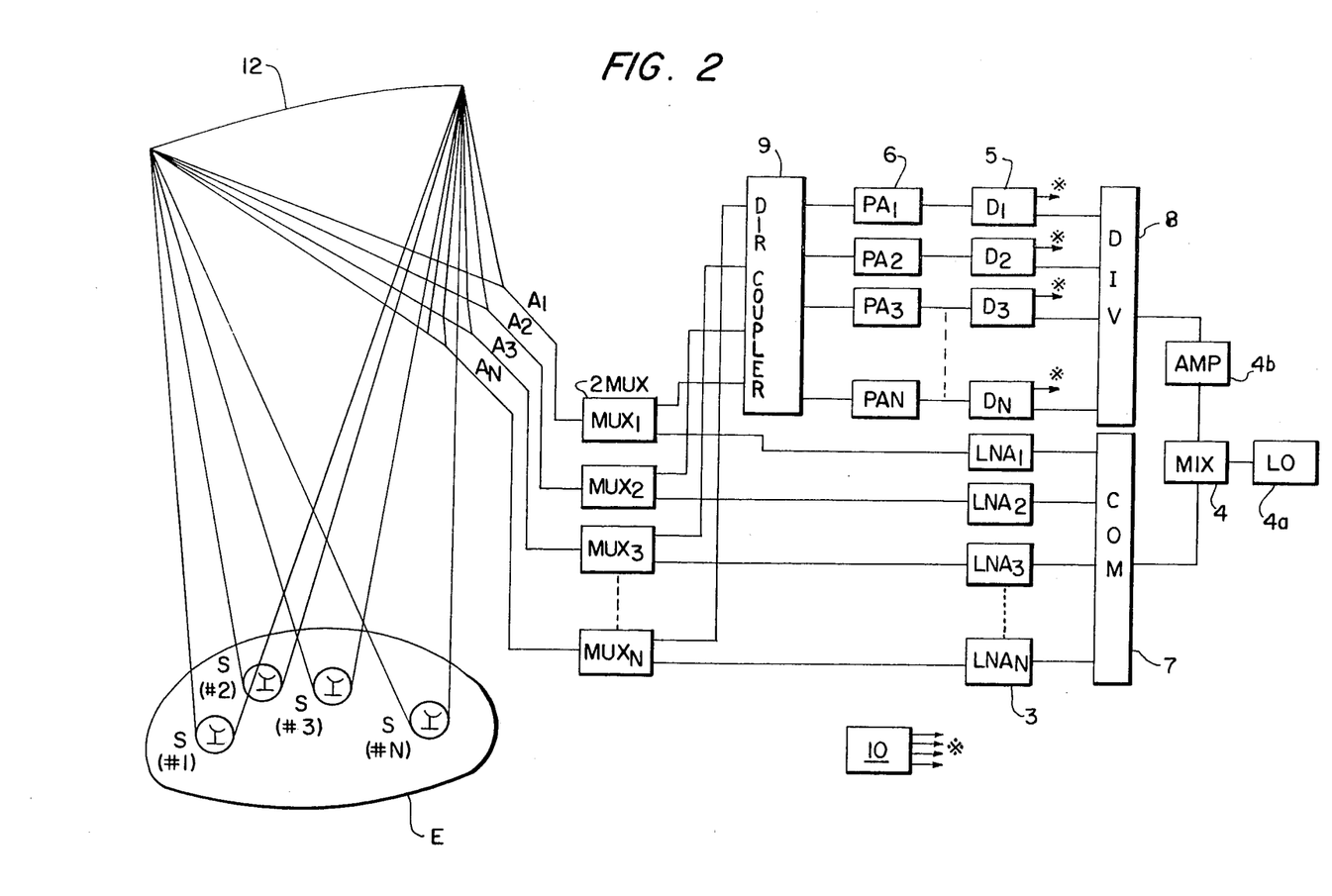
FIG. 2 is the block-diagram of the satellite relay system according to the present invention.

FIG. 2 shows the block-diagram of the satellite relay system according to the present invention. In the figure, the symbol E shows the earth, S(#1), S(#2), S(#3) and S(#n) are earth stations, and the circle surrounding each earth station shows the service area of each spot beam. The symbol $A(A_1, A_2, A_3, , , A_n)$ is a spot beam antenna having sharp directivity, and each antenna covers the corresponding service area as shown in the drawing. It should be appreciated that the antenna A can be composed of either a plurality of antenna elements such as that shown in FIG. 1 or the combination of a single reflective mirror 12 and a plurality of primary projectors $A_1, A_2 \ldots A_N$, such as that shown in FIG. 2. MUX is a multiplexer ($MUX_1$, $MUX_2$, $MUX_3 \ldots MUX_N$) for the common use of a single antenna as a transmission antenna and a reception antenna. Of course, separate transmission and reception antenna without an antenna multiplexer are possible. 3 is a low noise amplifier ($LNA_1$, $LNA_2$, $LNA_3 \ldots LNA_N$) connected to the reception output of the antenna multiplexer, 4 is a frequency mixer for converting the up-link signal frequency to the down-link signal frequency, 4a is a local oscillator for that conversion, and 4b is an amplifier connected to the output of said mixer 4. 5 is a variable phase shifter ($D_1, D_2, D_3 \ldots D_N$) for shifting the signal phase for scanning the transmission beams and said phase shifter 5 is controlled by the phase shift control unit 10. 6 is a power amplifier ($PA_1$, $PA_2$, $PA_3 \ldots PA_N$), 7 is a power combiner for combining the outputs of the low noise amplifiers 3 to the single input of the mixer 4, and 8 is a power divider. 9 is the 2n-port-directional-coupler having n number of input terminals and n number of output terminals. In said 2n-port directional coupler, each power input to any one of the input terminals is divided to n number of output terminals, that is to say, when the power input at each input terminal is $P_0, P_1, P_2 \ldots P_N$, respectively, each output terminal has the output power of $(P_0/n)+(P_1/n)+(P_2/n)+ \ldots +(P_{N/n})$.

The features of the system in FIG. 2 over the prior art shown in FIG. 1 are that (a) each antenna has sharp directivity or a narrow spot beam, (b) no phase shifter is provided at the reception side, that is, between the output of a low noise amplifier and the input of the divider, and (c) the presence of the 2n-port-directional coupler 9.

Figure 3:
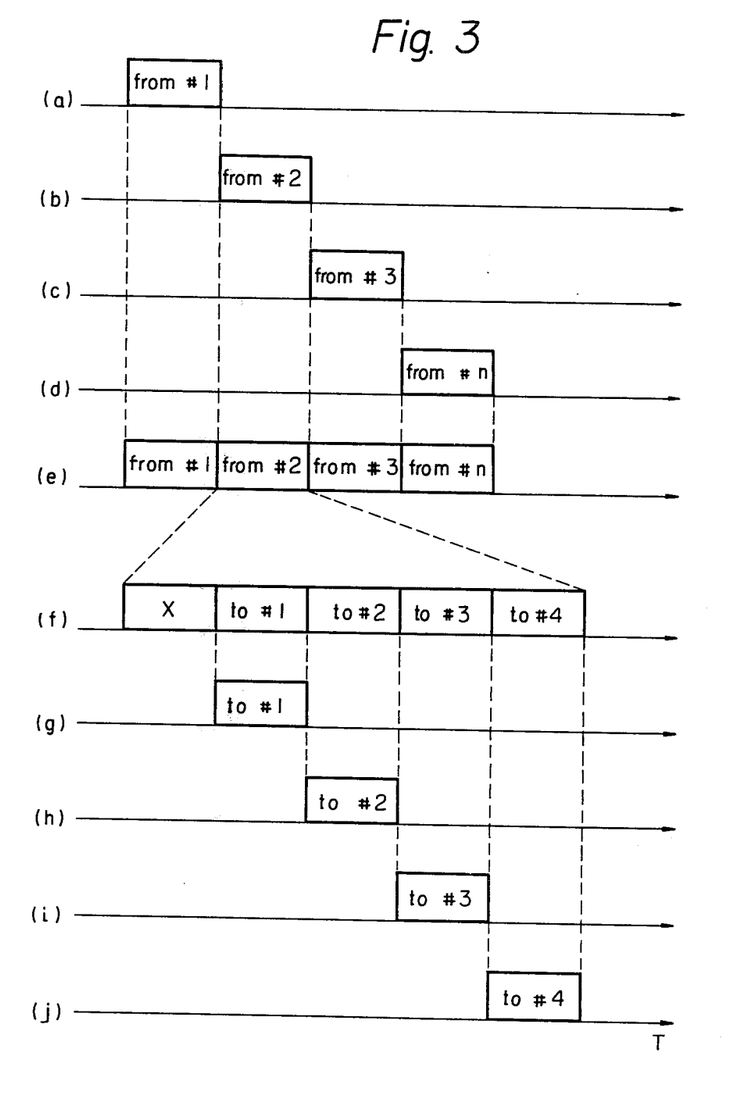
FIG. 3 is the operational time chart of the satellite relay system shown in FIG. 2.

FIG. 3 shows the frame structure of the signal for explaining the operation of the apparatus in FIG. 2. In FIG. 3, the symbols (a), (b), (c), and (d) show the burst signal of a TDMA signal sent from No. 1, No. 2, No. 3 and No. 4 earth stations respectively, and said burst signals are controlled so as not to overlap one another on a time axis. Those signals are received by antennas $A_1$ through $A_n$, and are amplified by the low noise amplifiers 3, the output of which is applied to the power combiner 7 to provide the combined signal (e) in FIG. 3. Each burst signal in the combined signal (e) has a pre-amble (X) for carrier and timing recovery, and a plurality of signals directed to No. 1, No. 2, No. 3 and No. 4 earth stations as shown in FIG. 3(f). The signal (e) is frequency-converted through the frequency mixer 4, the local frequency oscillator 4a and the amplifier 4b. The output of said amplifier 4b is applied to the antenna (A) through the power divider 8, the variable phase shifter 5, the power amplifier 6, 2-n-port-directional coupler 9, and the antenna multiplexer 2.

It should be appreciated that the 2n-port-directional-coupler 9 provides the output signals as shown in FIG. 3(g) through FIG. 3(j) provided that the variable phase shifter 5 controls the amount of phase shift $\theta_1$, $\theta_2$, $\theta_3$, and $\theta_4$ synchronized with each burst signal, and each of said signals shown in FIG. 3(g) through FIG. 3(j) is transmitted to the corresponding earth station. For instance, provided that n=4, the power input of the 2n-port-directional coupler 9 is $P_0/4$, the phases of each input signal of the coupler 9 are $\theta_1$, $\theta_2$, $\theta_3$, and $\theta_4$, respectively, then the output signals at the four output terminals of the coupler 9 are shown below.

$$P_0(1+\sin \alpha\cos \beta+\cos \beta\sin \gamma+\sin \gamma\sin \alpha)/4$$
$$P_0(1+\sin \alpha\cos \beta-\cos \beta\sin \gamma-\sin \gamma\sin \alpha)/4$$
$$P_0(1-\sin \alpha\cos \beta+\cos \beta\sin \gamma-\sin\gamma\sin \alpha)/4$$
$$P_0(1-\sin \alpha\cos \beta-\cos \beta\sin \gamma-\sin \gamma\sin \alpha)/4 \quad (1)$$

where
$\alpha=(\theta_1-\theta_2+\theta_3-\theta_4)/2, =(\theta_1-\theta_2-\theta_3+\theta_4)/2, \gamma=(\theta_1+\theta_2-\theta_3-\theta_4)/2$.

As the value $\alpha$, $\beta$ and $\gamma$ can be arbitrary, by designing the amount of phase shift of the variable phase shifter 5, the output power of each output terminal of the 2n-port-directional coupler can be designed as desired. For instance, provided that $\sin\alpha = \cos\beta = \sin\gamma = 1$, the value of each formula in the formula (1) is (P₀, 0,0,0), then the output signal shown in FIG. 3(g) is obtained. Next, provided that $\sin\gamma=-1$, $\sin\alpha=\cos\beta=1$, then, the value of each formula in the formula (1) is (0,P₀,0,0), and then the output signal shown in FIG. 3(h) is obtained. Next, provided that $\sin\alpha=-1$, $\cos\beta=\sin\gamma=1$, then the value of the formula (1) is (0,0,P₀,0), and then, the output signal shown in FIG. 3(i) is obtained. Further, provided that $\cos\beta=-1$, $\sin\alpha=\sin\gamma=1$, then, the value of the formula (1) is (0,0,0,P₀) and then, the output signal shown in FIG. 3(j) is obtained. The amount of phase shift $\theta_1, \theta_2, \theta_3, \theta_4$ by the variable phase shifter 5 for obtaining said value of $\alpha, \beta$ and $\gamma$ are controlled by the control circuit 10, the details of which will be described later.

Said formula (1) is generalized as follows.

$$P_k = \frac{P_0 A^2}{N^2} \left| \sum_{h=1}^{N} \exp\left(j\frac{\pi}{2}\left[\sum_{i=1}^{m}(r_i \oplus S_i + S_i)\right] + j\theta_h\right)\right|^2 \quad (2)$$

where, $P_k$ is the output power of the k'th output terminal,
$N = 2^m$,
$K = 1, 2, 3, , , n$
$P_0$ is the input power of the power divider
$A^2$ is the gain of the power amplifier at the output of the phase shifter,
$r_i$ and $S_i$ are determined as follows,
$k - 1 = r_1 + 2(r_2 + 2(,,,))$
$h - 1 = S_1 + 2(S_2 + 2(,,,))$
⊕ shows the exclusive OR logic, and
$\theta_h$ (r = 1,2 ,,, n) is defined as follows.

$$\theta_h = \frac{\pi}{2}\left[l - \sum_{i=1}^{m}(r_i \oplus S_i + S_i)\right] \quad (3)$$

where l is an integer.

It should be appreciated that the power divider 8, the phase shifter 5, the power amplifier 6 and the 2n-port-directional coupler 9 substantially compose a switching amplifier circuit. Accordingly, when an up-link signal from an earth station is synchronized with the switching operation of the switching amplifier circuit, a down-link signal shown in FIG. 3(g) through FIG. 3(j) is transmitted to each corresponding earth station. Further, it should be appreciated that the switching of a signal to be transmitted is substantially carried out by the variable phase shifter 9 which is inserted at the input of (not output) the power amplifier 6, that is to say, the switching operation is carried out at the low signal level stage. That fact that the switching is performed at the low signal level stage is one of the features of the present invention.

Figure 4:
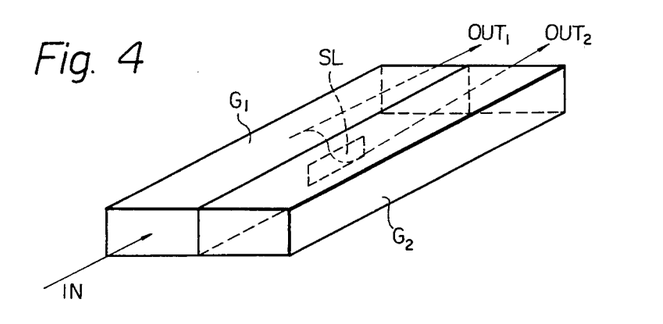
FIG. 4 is the embodiment of the structure of a hybrid circuit.

The power combiner 7, the power divider 8 and the 2n-port-directional coupler 9 in FIG. 2 can be implemented by using a conventional 90° hybrid circuit or a 180° hybrid circuit. FIG. 4 shows the structure of the 90° hybrid circuit, in which the waveguides G₁ and G₂ have a common slit SL. The input power(IN) to the first waveguide G₁ is divided by the slit SL and half of the input power is provided at the output of the first waveguide G₁ as OUT₁, and the other half of the input power is provided at the output of the second waveguide G₂ as OUT₂.

Figure 5:
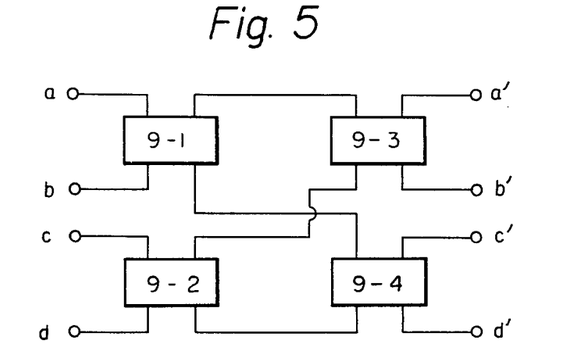
FIG. 5 is the embodiment of the 2n-port directional coupler utilized in the system in FIG. 2, FIG. 6(A), FIG. 6(B) and FIG. 6(C) are some examples of the connection of the hybrid circuit shown in FIG. 4.
Figure 6A:
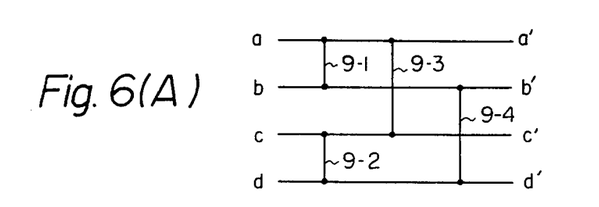
Figure 6B:
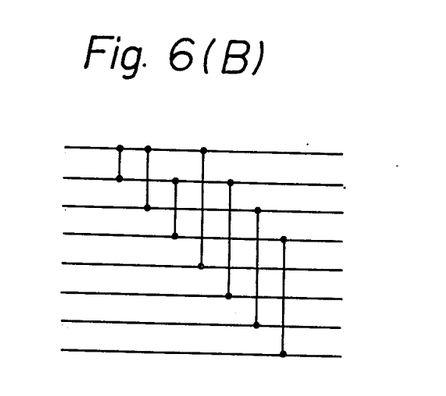
Figure 6C:
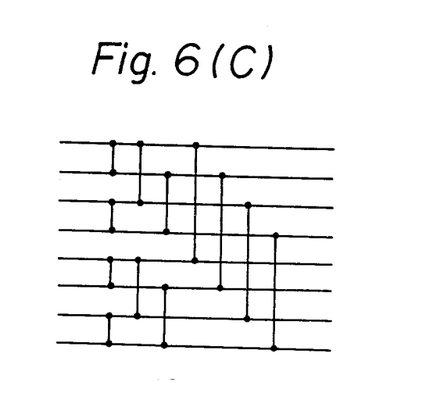

FIG. 5 shows the circuit diagram of the 2n-port-directional coupler using the hybrid circuit shown in FIG. 4, where n=4. In FIG. 5, the reference numerals 9-1 through 9-4 are hybrids shown in FIG. 4, and the symbols (a) through (d) are input terminals, and (a') through (d') are output terminals. The hybrid circuit operates as a coupler between any two terminals. The structure of FIG. 5 is denoted as shown in FIG. 6(A) for the sake of simplicity. FIG. 6(B) shows a power divider with a single input terminal and eight output terminals, and FIG. 6(C) shows another 2n-port directional coupler with n=8. Of course a vertical line in FIGS. 6(B) and 6(C) is a hybrid circuit in FIG. 4.

The value (n) of a 2n-port directional coupler is not restricted to the value in the form of $2^m$ like 2,4,8,16,32 ,,,, but any value is possible by utilizing the particular coupler which divides the input power with the arbitrary ratio.

The structure of a variable phase shifter 5 has been known. For example, a branched circuit, one of the branches of which is terminated by a PIN diode, can be utilized as a variable phase shifter. The bias voltage of the PIN diode controls the impedance of the PIN diode, and controls in turn the reflection ratio of the branch to provide a desired phase shift.

A low noise amplifier 3, a mixer 4, a local oscillator 4a, an amplifier 4b, and a power amplifier 6 can also be implemented by conventional technology. For instance a GaAs field effect transistor can be utilized for those circuits.

The phase shifter control unit 10 in FIG. 2 is also conventional, and is, for instance, disclosed in FIG. 2 of the U.S. Pat. No. 3,928,804.

Figure 7:
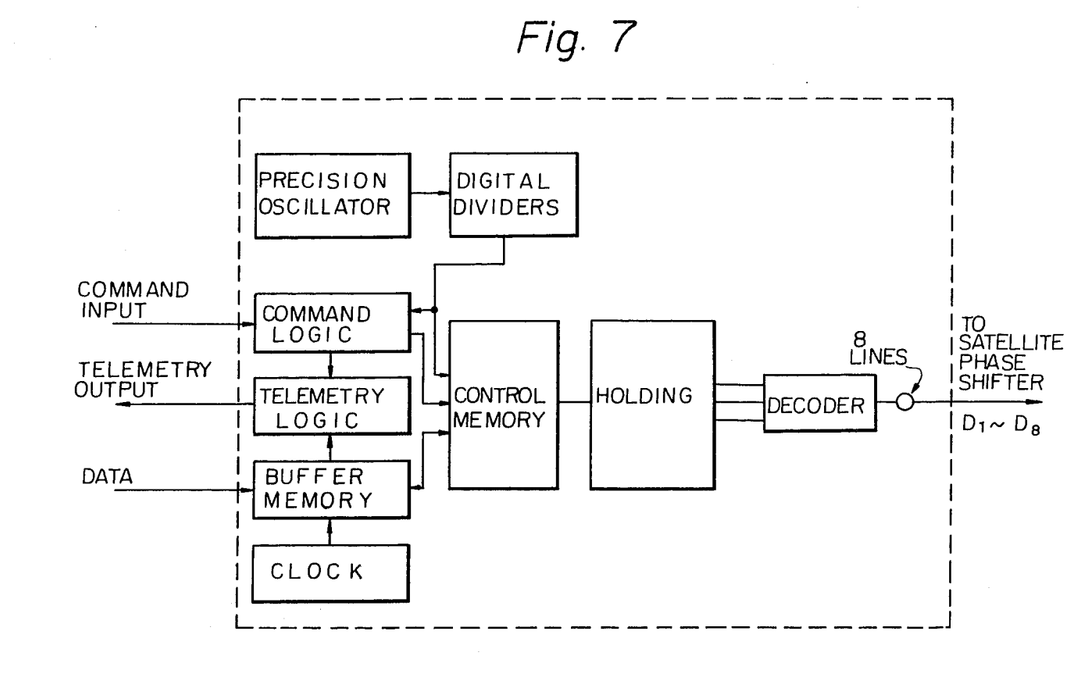
FIG. 7 is the block-diagram of the phase shifter control unit in FIG. 2.

FIG. 7 is the block-diagram of such a conventional phase shifter control unit.

Figure 8:
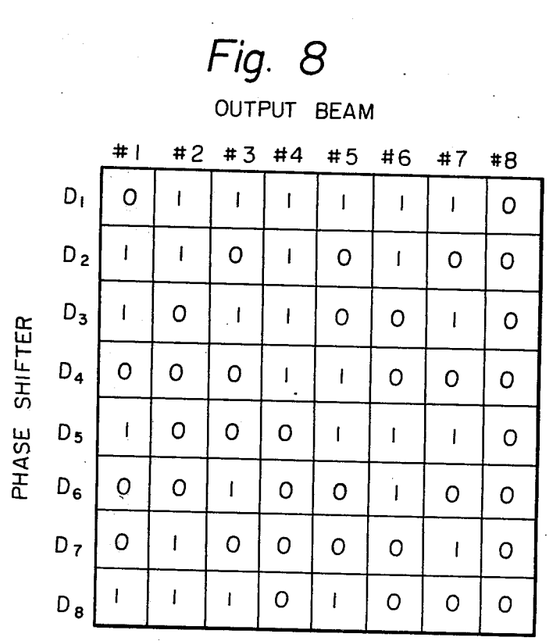
FIG. 8 shows the operation of said phase shifter control unit.

The switching pattern data for the phase shifter is stored in the control memory. That data is converted to each command-dependent switching pattern data according to the command sent through the command logic unit. The converted data is temporarily stored in the buffer memory, and then stored in the control memory. The telemetry logic unit is provided for sending back the content of the control memory to an earth station. The clock unit controls the telemetry logic unit. The precision oscillator and the digital dividers provide the basic timing signal for control of the variable phase shifter. Each frame of TDMA signal has, for instance, 125 frame units, each of which has 6 micro second duration. During the first frame unit the control data for the other 124 frame units for each phase shifter is transferred from the control memory to the holding register. The data word has three bits provided that n=8. The data word in the holding register is transferred to the decoder by each three-bit byte in parallel. The decoder determines the amount of phase shift of each variable phase shifter as shown in FIG. 8, according to the destination defined by said data word. In FIG. 8, "1" corresponds to a phase shift of 180 degrees, and "0" corresponds to a phase shift of 0 degree. For instance, provided the data word is "110" (in binary), the destination is the 6'th earth station, then the variable phase shifters D₀ through D₇ are controlled so that the amount of phase shift is 180°, 180°, 0°, 0°, 180°, 180°, 0°, and 0°, respectively.

Now other embodiments of the present invention will be described in accordance with FIGS. 9 through 14.

Figure 9:
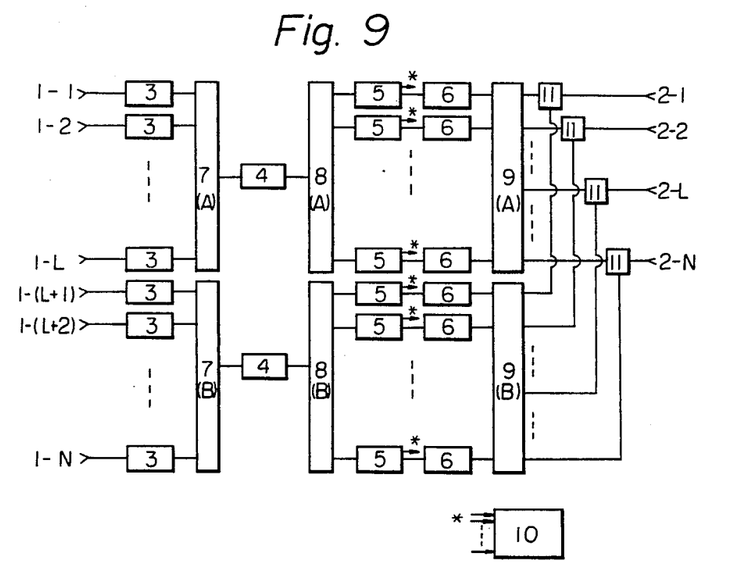
FIG. 9 is the block-diagram of another embodiment of the satellite relay system according to the present invention.
Figure 10:
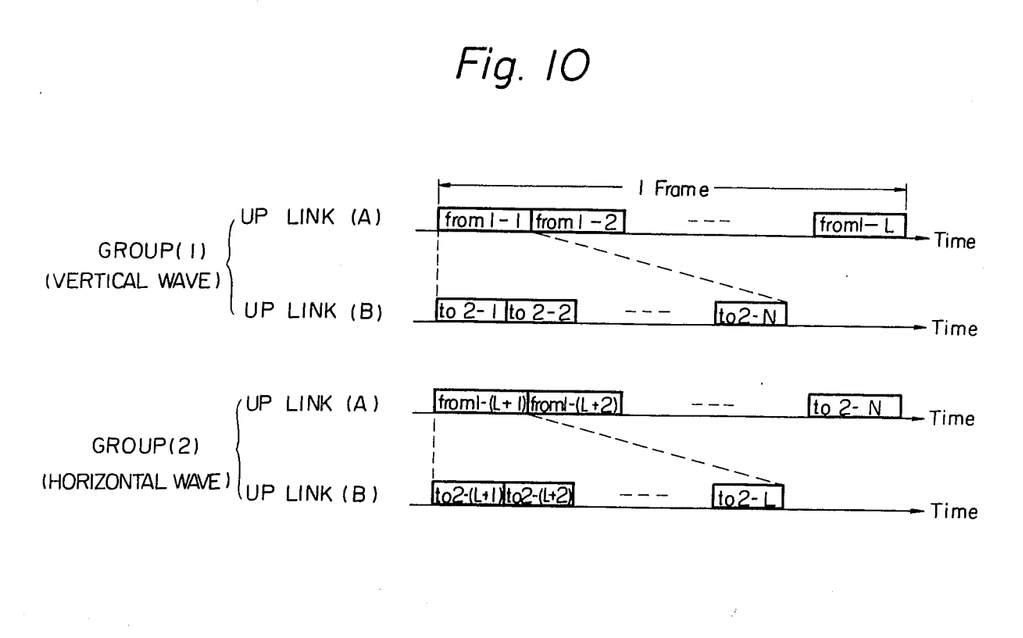
FIG. 10 is the operational time chart of the system shown in FIG. 9.

FIG. 9 shows the block-diagram of another satellite relay system according to the present invention, in which the reference numerals 1-1 through 1-n are receiving antennas, 2-1 through 2-n are transmission antennas, 3 is a low noise amplifier, 4 is a frequency translator/amplifier, 5 is a variable phase shifter, 6 is a power amplifier, 7(A) and 7(B) are power combiners, 8(A) and 8(B) are power dividers, 9(A) and 9(B) are 2n-port directional couplers, 10 is a phase shifter control unit, and 11 is a polarized signal combiner. FIG. 10 shows the signal structure of an up-link signal and the signal structure of a down-link signal in each burst of said up-link signal. It should be noted in FIG. 9 that reception and transmission antenna operations can be unified by using an antenna multiplexer as shown in FIG. 2.

FIG. 10 shows the operational time chart of the apparatus of FIG. 9. The first group of antennas 1-1 through 1-L correspond to L number of earth stations, which transmit a vertically polarized wave, and another group of antennas $1-(L+1)$ through 1-N, where $L<N$, correspond to N-L number of earth stations, which transmit a horizontally polarized wave. The up-link burst signals from each earth station are received by the antennas 1-1 through 1-N, and are amplified by the low noise amplifiers 3. The outputs of the low noise amplifiers 3 of each group are combined by the power combiners 7(A) and 7(B), the outputs of which are arranged on a time axis as shown in FIG. 10 (up-link (A) of the first group (vertical wave) and up-link(B) of the second group (horizontal wave)). The outputs of the power combiners 7(A) and 7(B) are applied to the frequency translator/amplifiers 4, which converts the frequency to the down-link frequency. The down-link signal is switched according to the destination of each burst signal by the switching amplifier circuit comprising power dividers 8(A) and 8(B), the variable phase shifters 5, the power amplifiers 6 and the 2n-port-directional couplers 9(A) and 9(B). The output of the first 2n-port-directional coupler 9(A) is a vertical wave, and the output of the second coupler 9(B) is a horizontal wave. Those two polarized waves are multiplexed by the polarization multiplexer 11, the output of which is transmitted to earth stations through antennae 2-1 through 2-N. The switching control unit or the phase shift control unit 10 is connected to all the variable phase shifters 5, and controls the amount of phase shift of all the shifters so that the desired output signal for each destination earth station is obtained at the outputs of the 2n-port-directional couplers. In this case, the outputs of two 2n-port-directional couplers are not connected to a single antenna at the same time. Provided that the up-link signals from earth stations to a satellite station are synchronized with the switching operation of the switching amplifier circuit of the satellite station, the down-link signals from the satellite station to earth stations as shown in FIG. 10 (down-link signal (B) of first vertical wave group, and down-link signal(B) of second horizontal wave group) are obtained for each destination of the earth stations.

Figure 11:
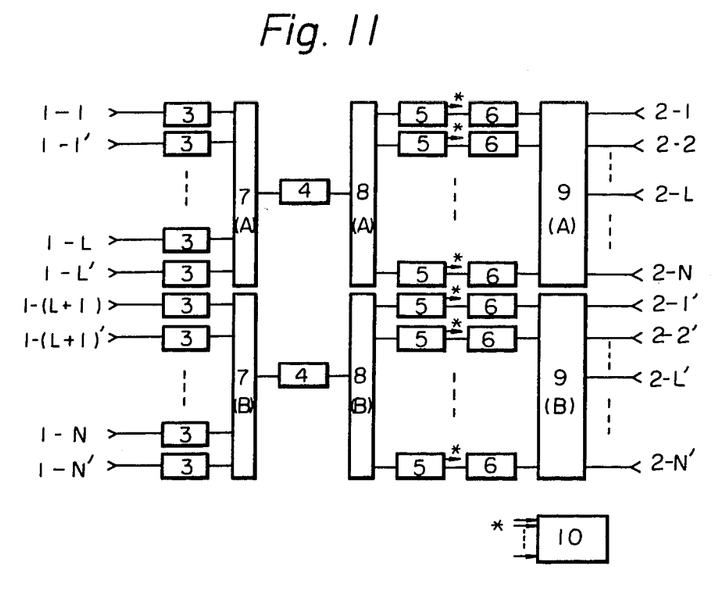
FIG. 11 is the block-diagram of still another embodiment of the satellite relay system according to the present invention.
Figure 12:
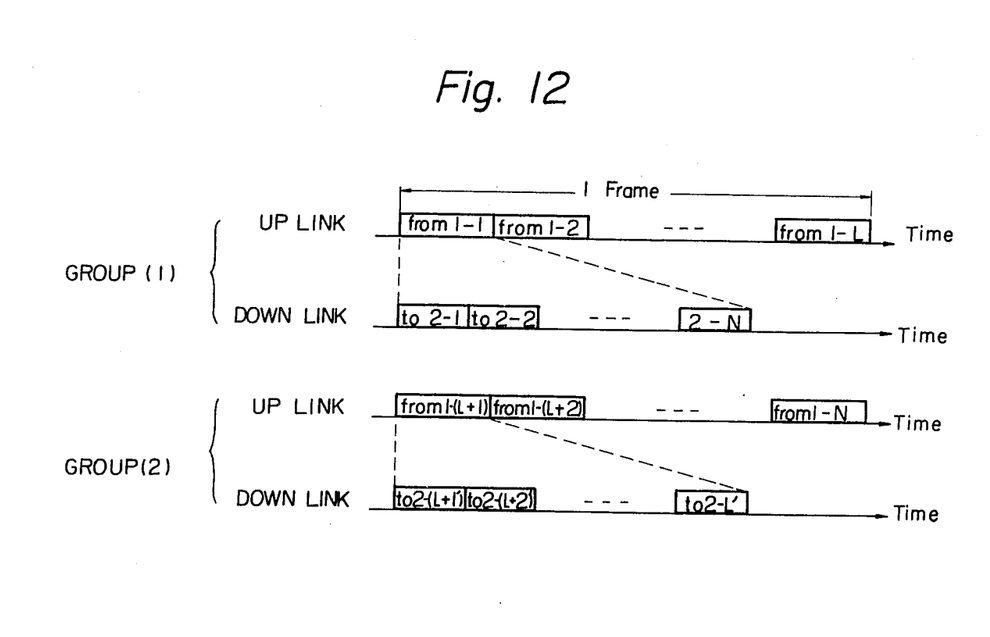
FIG. 12 is the operational time chart of the system shown in FIG. 11.

FIG. 11 shows another embodiment of the present satellite relay system, in which the reference numerals 1-1 through 1-N, 2-1 through 2-N, and 3 through 10 show the same members as those in FIG. 9. The reference numerals 1-1' through 1-N' are spot-beam receiving antennas, each of which covers the same area as that of the antennas 1-1 through 1-N, and 2-1' through 2-N' are transmitting spot-beam antennas each of which covers the same area as that of the antennas 2-1 through 2-N. The signal structure of the up-link signal and the down-link signal is shown in FIG. 12.

The operation of the apparatus in FIG. 11 will be described in accordance with FIG. 12.

The N number of service areas on the earth are grouped to the L number of the first group and N-L number of the second group. The up-link signal of the former group utilizes a vertically polarized wave, that of the latter group utilizes a horizontally polarized wave. The up-link burst signals from earth station are received by the antennas 1-1 through 1-N and the antennae 1-1' through 1-N', the outputs of which are amplified by the low noise amplifiers 3. The power combiners 7(A) and 7(B) combine the outputs of the amplifiers 3, and the combined up-link signals of each group are shown in FIG. 12. When combining the up-link signals by the power combiners, the gain may be doubled provided that a pair of spot-beams of the same area are combined in-phase. It should be appreciated that even when there is something wrong with a single low noise amplifier 3, the circuit is not broken since each area is illuminated by a pair of spot-beam antennas. Thus, the system reliability of the apparatus in FIG. 11 is improved. The outputs of the power combiners 7(A) and 7(B) are applied to the frequency translators/amplifiers 4 which provide a down-link frequency. The outputs of said frequency translators/amplifiers 4 are switched by the switching amplifier circuit composed of the power dividers 8(A) and 8(B), the variable phase shifters 5, the power amplifiers 6, and the 2n-port-directional couplers 9(A) and 9(B), and each burst signal directed to each earth station is transmitted to the earth stations through the antennas 2-1 through 2-N and the antennas 2-1' through 2-N'. The switching control unit 10 controls all the variable phase shifters 5 so that the input signal of the power dividers 8(A) and 8(B) is distributed on the outputs of the 2n-port-directional coupler 9 according to the destination of each burst signal. Provided that the switching operation for the up-link signal in the satellite system is synchronized with the burst signals, the down-link signals shown in FIG. 12 are transmitted to each destination on the earth.

Figure 13:
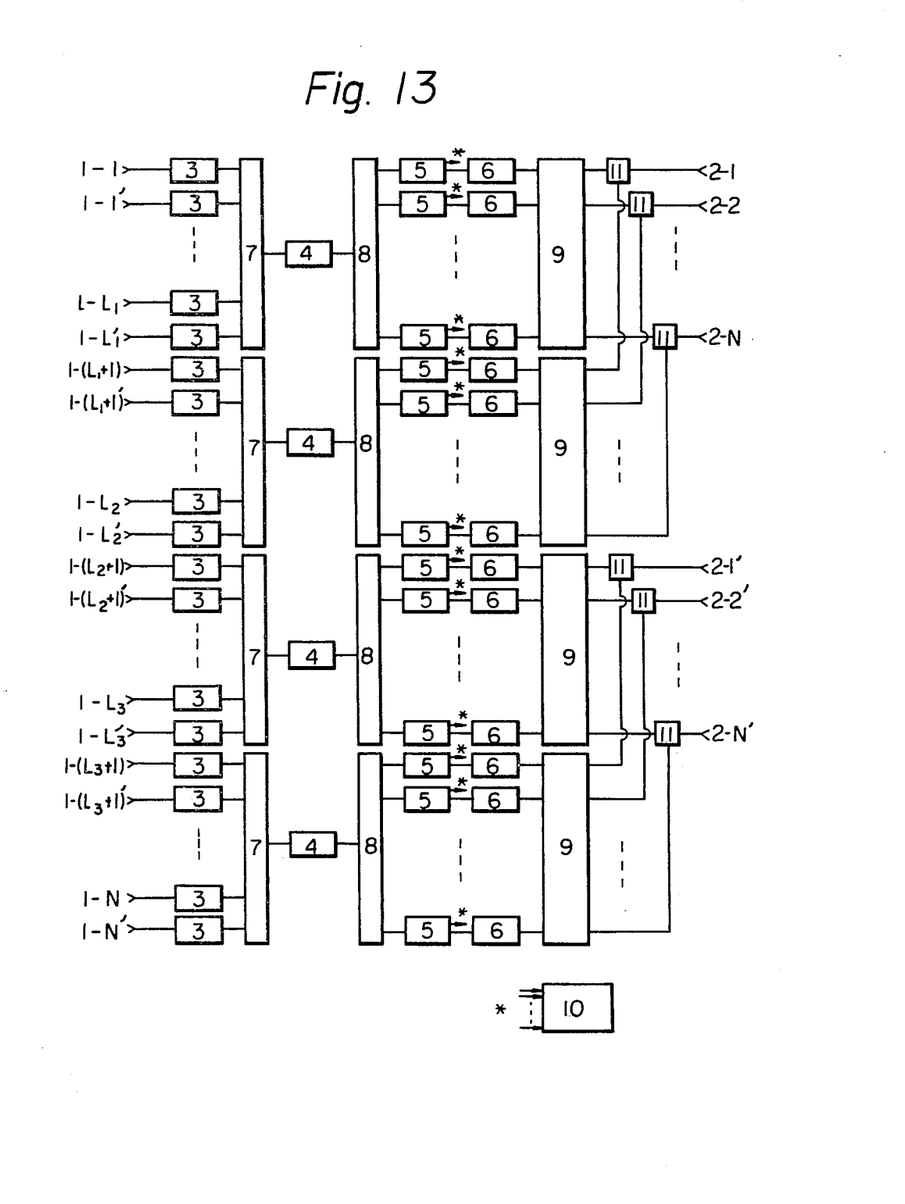
FIG. 13 is the block-diagram of still another embodiment of the satellite relay system according to the present invention.
Figure 14:
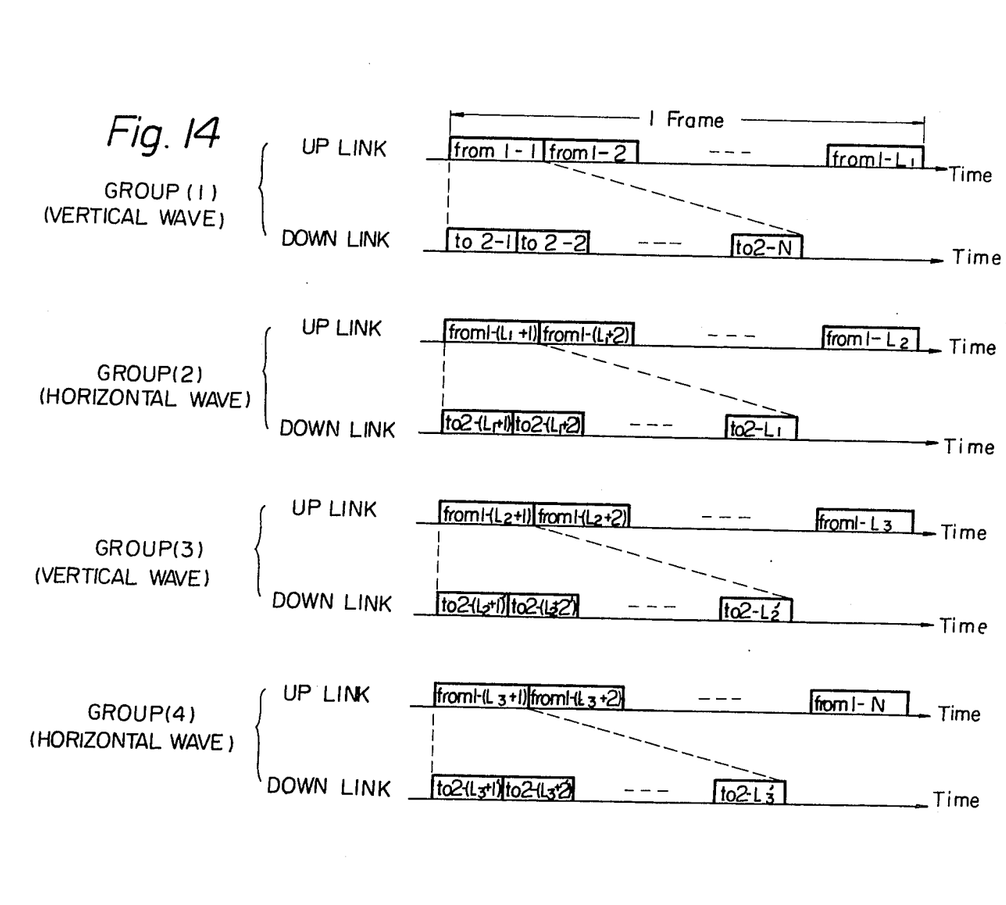
FIG. 14 is the operational time chart of the system shown in FIG. 13.

FIG. 13 shows still another embodiment of the present satellite relay system, and the reference numerals 1-1 through 1-N, 1-' through 1-N', 2-1 through 2-N, 2-1' through 2-N' and 3 through 11 show the same members as those shown by the same reference numerals in FIG. 9 or FIG. 11. And FIG. 14 shows the signal structure of the up-link signals and the contents of each burst signal of the up-link signals in the apparatus in FIG. 13. Said contents of each burst signal of up-link signals are of course down-link signals.

The operation of FIG. 13 will be described in accordance with FIG. 14.

The antennas 1-1 through 1-N and 1-1' through 1-N' divide N number of service area into four groups, each of which has $L_1$, $L_2-L_1$, $L_3-L_2$, and $N-L_3$ number of service areas, respectively, where $N<L_3<L_2<L_1$. The polarization of up-link signals is different between adjacent earth station, and the polarization of each earth station is a vertically polarized wave for two groups of the satellite station, and a horizontally polarized wave for the other two groups of the satellite station. The up-link burst signals from each earth stations are received by the antennas 1-1 through 1-N and 1-1' and 1-N', the outputs of which are applied to the power combiners 7 through the low noise amplifiers 3. The output of the power combiner is the time sequence signal as shown in FIG. 14. In this case, the spot-beams of the same service areas are combined in-phase and thus improved reliability is also attained. The outputs of the power combiners 7 are applied to the frequency translators/amplifiers 4, the outputs of which are applied to the switching amplifier circuit composed of the power dividers 8, the variable phase shifters 5, the power amplifiers 6 and the 2-n-port-directional couplers 9. Thus, the burst down-link signals are directed to each destination on the earth. Among four 2n-port-directional couplers, the outputs of two of them are vertically polarized, and the outputs of the other two of them are horizontally polarized. The polarization multiplexer 11 multiplexes two outputs and transmitts the multiplexed signals to the earth through the antennas 2-1 through 2-N and 2-N'. The switching control unit 10 controls all the variable phase shifters 5 and controls the amount of phase shift in those phase shifters so that the input burst signals of the power divider 8 is distributed on the outputs of the 2n-port-directional coupler 9 according to the destination of each burst signal. In this case, it is supposed that the outputs of a pair of 2n-port-directional couplers are connected to an antenna through a polarization multiplexer 11. Provided that the up-link signals from each earth station are synchronized with the switching operation in the satellite relay system, the down-link signals shown in FIG. 14 are provided for each destination on the earth.

Although a single beam in each system scans the earth stations in the above embodiments, the communication capacity of the satellite relay system can be increased by providing a plurality of transmitting spot beams and a plurality of receiving spot beams which operate simultaneously. In this case, preferably a vertically polarized wave is transmitted or received at the same time as a horizontally polarized wave. Further, it is supposed that each earth station is not covered by the two beams simultaneously.

Figure 15:
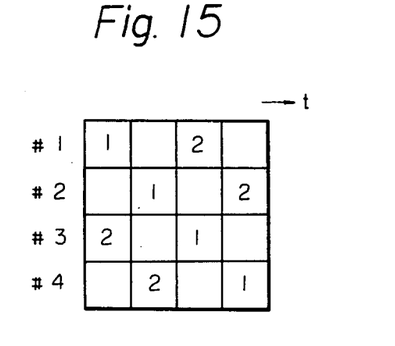
FIG. 15 shows the time sequence of the scanning beam according to the present invention.

FIG. 15 shows an example of the multi-beam scanning mentioned above. In FIG. 15, the horizontal axis shows time, and the vertical axis shows destination. In FIG. 15, the first beam covers the earth stations No.1, No.2, No.3, No.4 in sequence, and the second beam scans the earth stations in the sequence of No.3, No.4, No.1, and No.2. Accordingly, the No.1 station and the No.3 station are covered at the same time, and the No.2 station and the No.4 station are covered at the same time, thus the communication capacity of the satellite system is doubled.

As mentioned above, according to the present invention, multi-beam antennas are utilized, up-link signals from earth stations are merely power-combined, down-link signals to earth stations are processed through beam scanning, and thus, switching between the earth stations is possible. Accordingly, a spot beam antenna with high gain can be utilized, and high power transmission from the satellite station is possible by the power combination. Further, the communication capacity can be increased by using a plurality of scanning beams at the same time. Further, provided that the second beam is utilized as a stand-by circuit, the reliability of the satellite system is considerably increased.

Finally, the particular effects of the present invention are enumerated.

(1) The number of antenna elements is independent from the gain of each antenna element, and is enough to provide the same number of antenna elements as that of the earth stations. Therefore, the number of antenna elements can be reduced compared with that of a prior phased array system.

(2) Since a spot beam is provided for each earth station, power leakage outside the service area is very small, and the substantial gain in the service area is increased.

(3) A 2n-port-directional coupldler can be composed of 90° hybrid circuits or 180° hybrid circuits, and in this case a variable phase shifter is enough to perform only 0° shift or 180° shift. That is to say, beam scanning is performed by only a one-bit phase shifter.

From the foregoing it will not be apparent that a new and improved satellite relay system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A TDMA satellite relay system comprising:
   a power divider means having a single input and n output terminals where n is an integer, said power divider means receiving a TDMA input signal having a plurality of non-overlapped burst signals relating to a different earth station and distributing the power in said inut signal to each of said output terminals,
   n phase shifters, each coupled to a corresponding output of said power divider,
   n power amplifiers, each coupled to a corresponding output of said phase shifters,
   a 2n-port directional coupler means consisting of n number of input terminals, each coupled to a corresponding power amplifier, n number of output terminals, and a plurality of couplers between said input terminals and said output terminals wherein the input power of any one of the input terminals is equally distributed to all the output terminals,
   n number of transmission antennas, each coupled to a corresponding output of said 2n-port directional coupler means, and each antenna having a narrow spot beam covering a single specific earth station with no overlap therebetween, and
   a phaseshifter control for controlling said phase shifters such that each burst signal in the TDMA signal is connected to a corresponding antenna on a time divisional basis through said 2n-port directional coupler means wherein said phase shifter control synchronizes said phase shifters with said burst signal.

2. A TDMA satellite relay system according to claim 1 further comprising n number of reception antennas, each having a narrow spot beam covering a single specific earth station, n number of amplifiers each coupled to a corresponding reception antenna, a power combiner for combining all the outputs of said amplifiers, and a frequency mixer for converting the frequency of said power combiner and providing the converted signal to the input of said power divider means.

3. A TDMA satellite relay system according to claim 2, wherein a transmission antenna functions as a reception antenna through an antenna multiplexer.

4. A TDMA satellite relay system according to claim 3 including a single reflection mirror common to all said antennas.

5. A TDMA satellite relay system according to claim 1 wherein said couplers of said 2n-port directional coupler means includes a plurality of 90° hybrid circuits.

6. A TDMA satellite relay system according to claim 1 wherein said n number of transmission antennas relates to a vertically polarized wave and a horizontally polarized wave, wherein said vertically and horizontally polarized waves do not cover a specific earth station at the same time.

7. A TDMA satellite relay system according to claim 1 wherein each of said phase shifters is a one-bit phase shifter.

* * * * *